US009767871B2

(12) United States Patent
Kim

(10) Patent No.: US 9,767,871 B2
(45) Date of Patent: Sep. 19, 2017

(54) SENSE AMPLIFIER OF SEMICONDUCTOR DEVICE

(71) Applicant: SK hynix Inc., Icheon-si, Gyeonggi-do (KR)

(72) Inventor: Bum Su Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/135,809

(22) Filed: Apr. 22, 2016

(65) Prior Publication Data

US 2016/0315592 A1 Oct. 27, 2016

(30) Foreign Application Priority Data

Apr. 22, 2015 (KR) ........................ 10-2015-0056746

(51) Int. Cl.
*H03F 3/45* (2006.01)
*G11C 7/12* (2006.01)
*G11C 7/06* (2006.01)
*G11C 5/02* (2006.01)

(52) U.S. Cl.
CPC ............... *G11C 7/12* (2013.01); *G11C 5/025* (2013.01); *G11C 7/065* (2013.01); *G11C 2207/005* (2013.01)

(58) Field of Classification Search
CPC ......................................................... H03F 3/45
USPC ....................................... 330/253, 261, 307
See application file for complete search history.

(56) References Cited

U.S. PATENT DOCUMENTS

| 5,939,903 | A  | * | 8/1999 | Lin ........................ G11C 7/065 327/55 |
| 7,123,531 | B2 | * | 10/2006 | Rho ....................... G11C 7/065 327/51 |
| 7,279,939 | B2 | * | 10/2007 | Burleson ............... G11C 7/062 327/51 |
| 8,116,149 | B2 |   | 2/2012 | Chen et al. |
| 2011/0317506 | A1 | * | 12/2011 | Lin ....................... G11C 11/412 365/203 |
| 2012/0213025 | A1 |   | 8/2012 | Koo |
| 2015/0124543 | A1 | * | 5/2015 | Lee .......................... G11C 7/12 365/202 |

FOREIGN PATENT DOCUMENTS

KR 1020120096294 A 8/2012

* cited by examiner

*Primary Examiner* — Henry Choe
(74) *Attorney, Agent, or Firm* — William Park & Associates Ltd.

(57) ABSTRACT

A sense amplifier of a semiconductor device is disclosed. The sense amplifier of a semiconductor device may include a PMOS latch transistor and an NMOS latch transistor formed in a cross-coupled latch type, and may be configured to sense and amplify a signal of a pair of bit lines. The sense amplifier of a semiconductor device may include a Yi transistor configured to output a data signal amplified by the PMOS latch transistor and the NMOS latch transistor according to a column control signal, and may share a well region with the PMOS latch transistor.

12 Claims, 4 Drawing Sheets

SENSE AMPLIFIER OF SEMICONDUCTOR DEVICE

CROSS-REFERENCE TO RELATED APPLICATION

The priority of Korean patent application No. 10-2015-0056746 filed on 22 Apr. 2015, the disclosure of which is hereby incorporated in its entirety by reference, is claimed.

BACKGROUND

1. Technical Field

Embodiments of the present disclosure generally relate to a sense amplifier of a semiconductor device, and more particularly to a sense-amplifier layout structure.

2. Related Art

A semiconductor memory device includes a sense-amplifier circuit configured to sense and amplify data stored in a memory cell, and output the amplified data.

The sensing method of a general bit line sense amplifier uses a differential pair sensing method, and the most popular sense amplifier is a cross-coupled latch sense amplifier.

FIG. 1 is a circuit diagram illustrating a general cross-coupled latch sense amplifier corresponding to a folded bit line structure.

In FIG. 1, the sense amplifier consists of: a bit line sense amplifier 2 configured to operate by power-supply signals (SAP, SAN) as well as to sense and amplify a signal difference between bit lines (BL, /BL); a precharge unit 4 enabled by a precharge signal (BLEQ) being output when the sense amplifier does not operate, so as to precharge the pair of bit lines (BL, /BL) with a precharge voltage (VBLP); an equivalent unit 6 enabled by the precharge signal (BLEQ) such that voltage levels of the bit lines (BL, /BL) are identical to each other; and a data output unit 8 configured to output a data signal amplified by the bit line sense amplifier to segment input/output (I/O) lines (SIO, SIOB) according to a column control signal (Yi). The signals of the segment I/O lines (SIO, SIOB) may be amplified by a local sense amplifier (LSA) (not illustrated) and then output to local I/O lines.

FIG. 1 is a circuit diagram of the sense amplifier 1.

Although the data output unit 8 of the sense amplifier 1 consists of at least one NMOS transistor, many developers and companies are conducting intensive research into methods for replacing the NMOS transistor of the data output unit 8 with at least one PMOS transistor to improve write time (tWR) deterioration characteristics.

However, assuming that the transistor of the data output unit 8 is implemented as the PMOS transistor, the region occupied by the sense amplifier unavoidably increases in size due to the characteristics of a PMOS transistor.

SUMMARY

In an embodiment, a sense amplifier of a semiconductor device may be provided. The sense amplifier of a semiconductor device may include a PMOS latch transistor and an NMOS latch transistor formed in a cross-coupled latch type, and configured to sense and amplify a signal of a pair of bit lines. The sense amplifier of the semiconductor device may include a Yi transistor configured to output a data signal amplified by the PMOS latch transistor and the NMOS latch transistor according to a column control signal, and share a well region with the PMOS latch transistor.

In an embodiment, a sense amplifier of a semiconductor device may be provided. The sense amplifier of the semiconductor device may include a bit line sense amplifier formed in a cross-coupled latch type, and configured to sense and amplify a signal of a pair of bit lines. The sense amplifier of the semiconductor device may include a first Yi transistor and a second Yi transistor configured to output the amplified data signal received from the bit line sense amplifier to a segment input/output (I/O) line according to a column control signal (Yi), and disposed at both sides of the bit line sense amplifier. The sense amplifier of the semiconductor device may include a local sense amplifier configured to amplify the data signal of the segment I/O line, output the amplified data signal to the local I/O line, and may be disposed between the first Yi transistor and a first cell region.

DETAILED DESCRIPTION

Various embodiments of the present disclosure may be directed to providing a sense amplifier of a semiconductor device that substantially obviates one or more problems due to limitations and disadvantages of the related art.

An embodiment of the present disclosure may relate to a layout structure for preventing the region occupied by the sense amplifier from being increased, even when a transistor configured to output the signal amplified by a bit line sense amplifier to a local sense amplifier according to a column control signal (Yi) is implemented with a PMOS transistor.

Reference will now be made to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
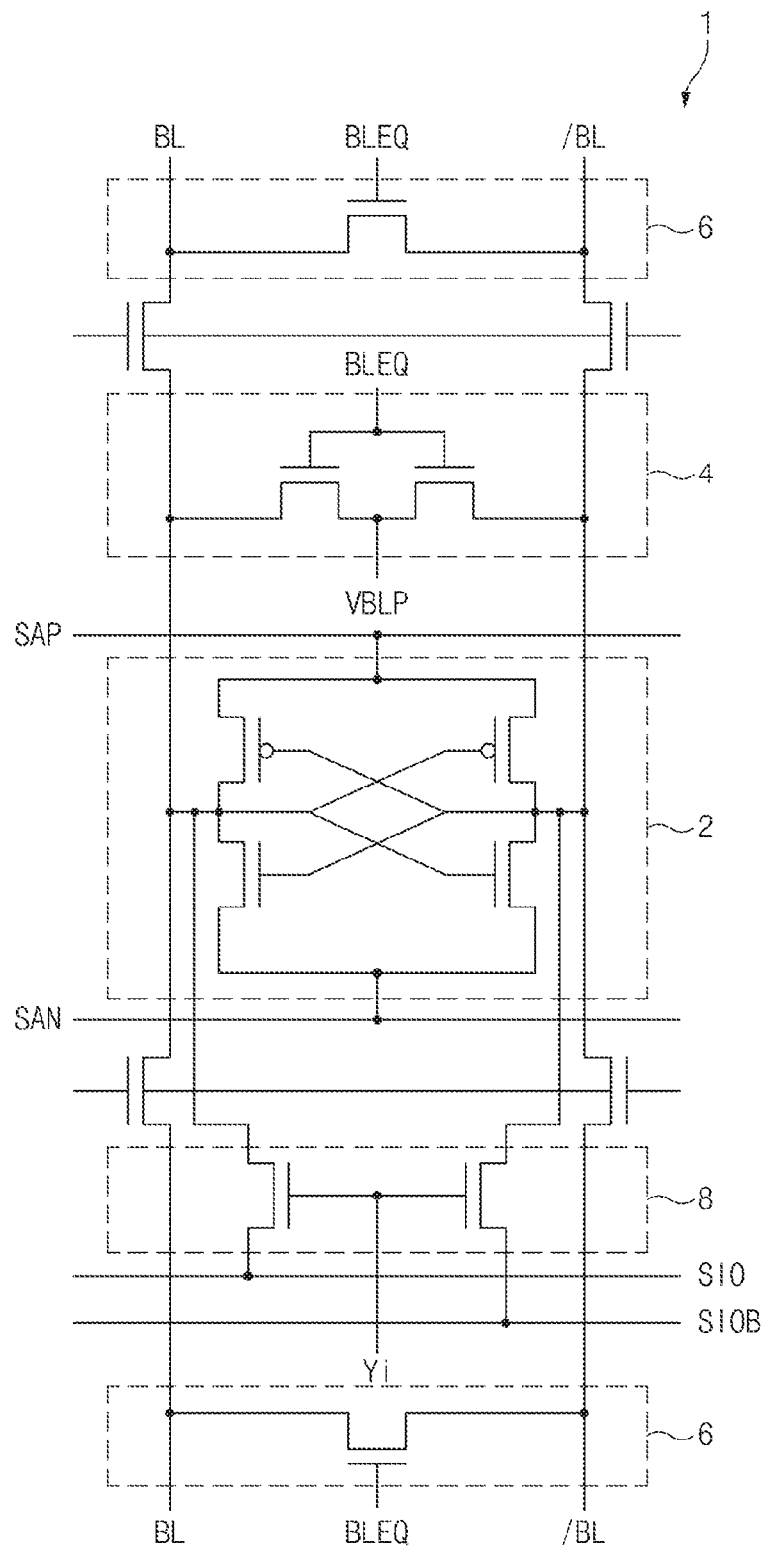
FIG. 1 is a circuit diagram illustrating a cross-coupled latch sense amplifier corresponding to a folded bit line structure.
Figure 2:
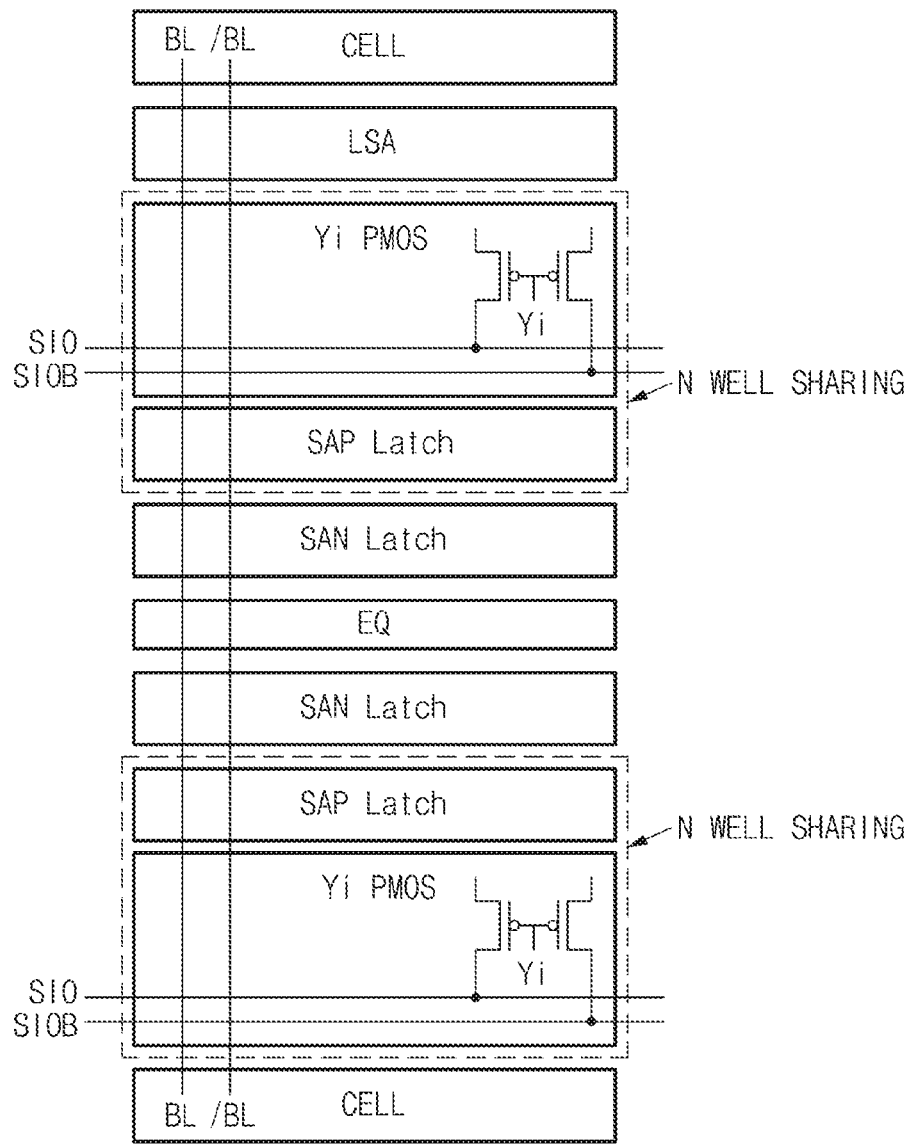
FIG. 2 is a plan view illustrating a representation of an example of a sense-amplifier layout structure according to an embodiment.
Figure 3:
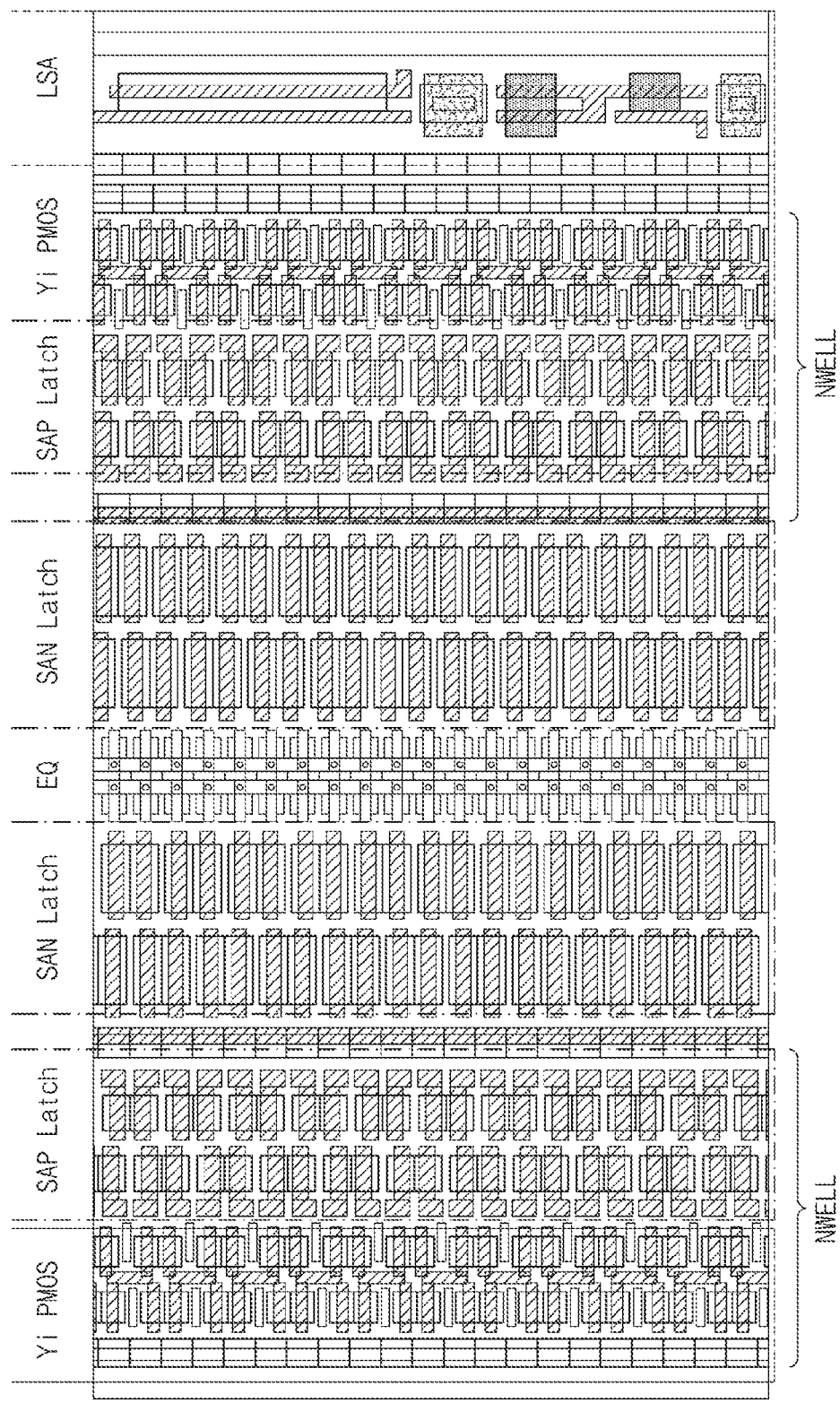
FIG. 3 is a plan view illustrating a representation of an example of a sense-amplifier layout structure of a semiconductor device according to an embodiment.

FIGS. 2 and 3 are a plan view illustrating a representation of an example of a sense-amplifier layout structure according to an embodiment.

Referring to FIGS. 2 and 3, the sense amplifier according to an embodiment may include latch transistors (SAN Latch, SAP Latch). Equivalent circuits (EQ) by which voltage levels of the bit lines (BL, /BL) are identical to each other are disposed at the center part of the pair of the latch transistors (SAN Latch, SAP Latch). The latch transistors (SAN Latch, SAP Latch) may be disposed at both sides of the equivalent circuits (EQ), may operate by the power-supply signals (SAP, SAN), and may thus construct a cross-coupled latch bit line sense amplifier. In this case, NMOS latch transistors (SAN Latch) configured to receive the power-supply signal (SAN) may be located closer to the equivalent transistors (EQ) than PMOS transistors (SAP Latch) receiving the power-supply signal (SAP). That is, the NMOS latch transistors (SAN Latch) may be disposed between the equivalent transistors (EQ) and the PMOS latch transistors (SAP Latch).

A plurality of Yi transistors (Yi PMOS) configured to selectively output cell data amplified by the bit line sense amplifier to the segment I/O lines (SIO, SIOB) according to a column control signal (Yi) may be disposed at the other side of the PMOS latch transistors (SAP Latch), and may be located adjacent to the other side of the PMOS latch transistors (SAP Latch). A local sense amplifier (LSA) for amplifying the data signal of the segment I/O lines (SIO, SIOB) and outputting the amplified data signal to the local I/O lines (SIO, SIOB) may be disposed in any one of the regions disposed between the cell region (CELL) and the Yi transistors (Yi PMOS).

Each Yi transistor (Yi PMOS) according to an embodiment may be implemented as a PMOS transistor. For example, the PMOS latch transistors (SAP Latch) may be located adjacent to the Yi transistors (Yi PMOS).

That is, assuming that the conventional Yi transistors are implemented as the NMOS transistors, the Yi transistors may be located adjacent to the cell region (CELL) and a local sense amplifier (LSA) may be disposed between the Yi transistors and the latch transistors (SAP Latch). However, assuming that the Yi transistors are implemented as the PMOS transistors, transistors of the cell region (CELL) are implemented as the NMOS transistors whereas the Yi transistors (Yi PMOS) are implemented as the PMOS transistors, and it is necessary to guarantee a sufficient space between the cell region (CELL) and the Yi transistors (Yi PMOS), such that the region occupied by the sense amplifier is relatively enlarged. Therefore, the position of Yi transistors (Yi PMOS) according to an embodiment is changed, such that the Yi transistors (Yi PMOS) are located adjacent to the same-type latch transistors (SAP Latch) and the local sense amplifier (LSA) is located adjacent to the cell region (CELL). Through the above-mentioned layout structure, a well region (NWELL) of the Yi transistors (Yi PMOS) is merged with a well region (NWELL) of the latch transistors (SAP Latch) such that the Yi transistors (Yi PMOS) and the latch transistors (SAP Latch) can share the merged well region. As a result, although each Yi transistor is implemented as a PMOS transistor, the entire region of the sense amplifier is not increased.

As is apparent from the above description, the sense amplifier of the semiconductor device according to an embodiment of the present disclosure can prevent the region occupied by the sense amplifier from being increased, even when a transistor configured to output the signal amplified by a bit line sense amplifier to a local sense amplifier according to a column control signal (Yi) is implemented as a PMOS transistor.

Figure 4:
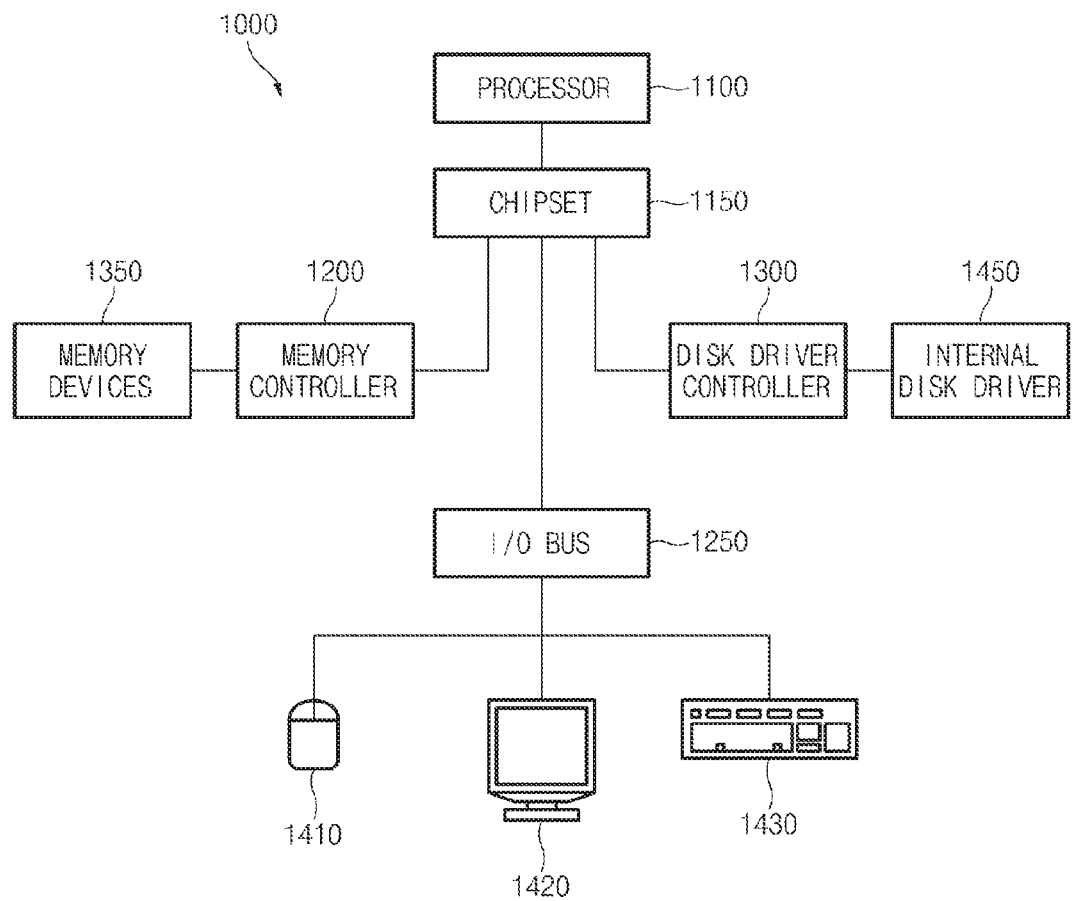
FIG. 4 illustrates a block diagram of an example of a representation of a system employing a sense-amplifier with the various embodiments discussed above with relation to FIGS. 2-3.

The sense-amplifier as discussed above (see FIGS. 2-3) are particular useful in the design of memory devices, processors, and computer systems. For example, referring to FIG. 4, a block diagram of a system employing a sense-amplifier in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one sense-amplifier as discussed above with reference to FIGS. 2-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one sense-amplifier as discussed above with relation to FIGS. 2-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a sense-amplifier as discussed above with relation to FIGS. 2-3. In alternate embodiments, such as, for example but not limited to, cellular phones or digital cameras, the components may differ from the embodiments illustrated in FIG. 4.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The embodiments not limited by the type of deposition, etching polishing, and patterning steps described herein. Nor is the embodiments limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A sense amplifier of a semiconductor device comprising:
a PMOS latch transistor and an NMOS latch transistor formed in a cross-coupled latch type, and configured to sense and amplify a signal from a pair of bit lines;
a Yi transistor connected to a column control signal (Yi), wherein the Yi transistor is configured to output a data signal amplified by the PMOS latch transistor and the NMOS latch transistor according to the column control signal, and
wherein the Yi transistor shares a well region with the PMOS latch transistor.

2. The sense amplifier of the semiconductor device according to claim 1, wherein the Yi transistor is located adjacent to the PMOS latch transistor.

3. The sense amplifier of the semiconductor device according to claim 2, further comprising:
a local sense amplifier configured to amplify the data signal generated from the Yi transistor, and disposed between the Yi transistor and a cell region.

4. The sense amplifier of the semiconductor device according to claim 3, wherein the Yi transistor is disposed between the PMOS latch transistor and the local sense amplifier.

5. The sense amplifier of the semiconductor device according to claim 1, wherein the NMOS latch transistor is disposed at both sides of an equivalent transistor by which a voltage level of one bit line contained in the pair of bit lines is identical to a voltage level of the other bit line contained in the pair of bit lines.

6. The sense amplifier of the semiconductor device according to claim 5, wherein the PMOS latch transistor is disposed between the NMOS latch transistor and the Yi transistor.

7. A sense amplifier of a semiconductor device comprising:
a bit line sense amplifier formed in a cross-coupled latch type, and configured to sense and amplify a signal from a pair of bit lines;
a first Yi transistor, a transistor connected to a column control signal (Yi), and a second Yi transistor configured to output the amplified data signal received from the bit line sense amplifier to a segment input/output (I/O) line according to the column control signal, and disposed at both sides of the bit line sense amplifier; and
a local sense amplifier configured to amplify the data signal of the segment I/O line, output the amplified data signal to the local I/O line, and disposed between the first Yi transistor and a first cell region.

8. The sense amplifier of the semiconductor device according to claim 7, wherein the bit line sense amplifier includes:
an NMOS latch transistor;
a first PMOS latch transistor disposed at one side of the NMOS latch transistor; and
a second PMOS latch transistor disposed at the other side of the NMOS latch transistor.

9. The sense amplifier of the semiconductor device according to claim 8, wherein the first Yi transistor is located adjacent to the first PMOS latch transistor, and is disposed between the first PMOS latch transistor and the local sense amplifier.

10. The sense amplifier of the semiconductor device according to claim 9, wherein the first Yi transistor and the first PMOS latch transistor share a well region with each other.

11. The sense amplifier of the semiconductor device according to claim 8, wherein the second Yi transistor is located adjacent to the second PMOS latch transistor, and is disposed between the second PMOS latch transistor and a second cell region.

12. The sense amplifier of the semiconductor device according to claim 11, wherein the second Yi transistor and the second PMOS latch transistor share a well region.

* * * * *